United States Patent [19]

Hadersbeck et al.

[11] 4,121,044
[45] Oct. 17, 1978

[54] FLEXIBLE THROUGH-CONTACTED PRINTED CIRCUITS

[75] Inventors: Hans Hadersbeck; Ernst Andrascek, both of Munich; Alfred Groeber, Stockdorf, all of Germany

[73] Assignee: Siemens Aktiengesellschaft, Berlin & Munich, Germany

[21] Appl. No.: 690,272

[22] Filed: May 26, 1976

[30] Foreign Application Priority Data

Jun. 3, 1975 [DE] Fed. Rep. of Germany ....... 2524581

[51] Int. Cl.² .............................................. H05K 1/00
[52] U.S. Cl. .................................... 174/68.5; 361/398
[58] Field of Search ..................... 174/68.5; 339/17 C; 361/397, 398

[56] References Cited

FOREIGN PATENT DOCUMENTS 1,814,804 10/1970 Fed. Rep. of Germany ........ 339/17 C
2,107,591 8/1972 Fed. Rep. of Germany .......... 174/68.5

Primary Examiner—Arthur T. Grimley
Attorney, Agent, or Firm—Hill, Gross, Simpson, Van Santen, Steadman, Chiara & Simpson

[57] ABSTRACT

A flexible printed circuit board has conductors on opposite sides thereof which are through-contacted by die-punching the board to form an angularly-displaced tongue portion about which solder is flowed to contact both conductors. A terminal pin is optionally inserted through the board to connect a component, the pin being engaged by the angularly-displaced tongue to ensure reliable mechanical and electrical contact in the soldered joint. The through-contact is formed with a bevel-faced die in conjunction with a cutting plate.

7 Claims, 5 Drawing Figures

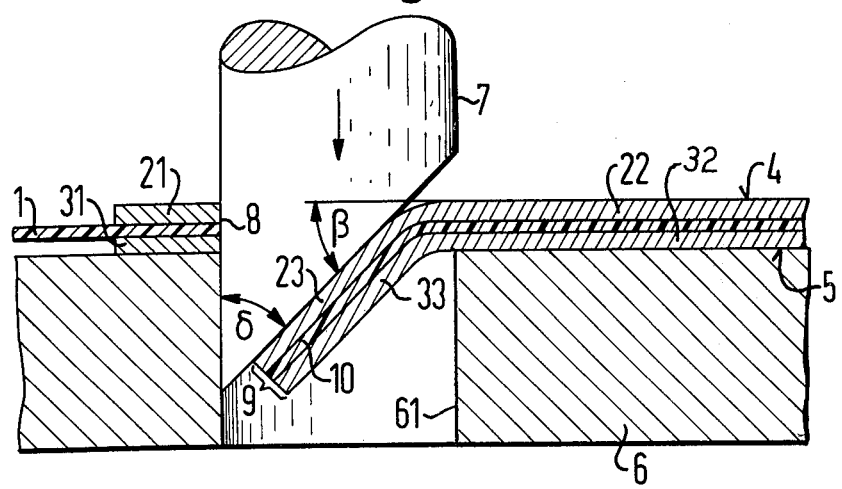
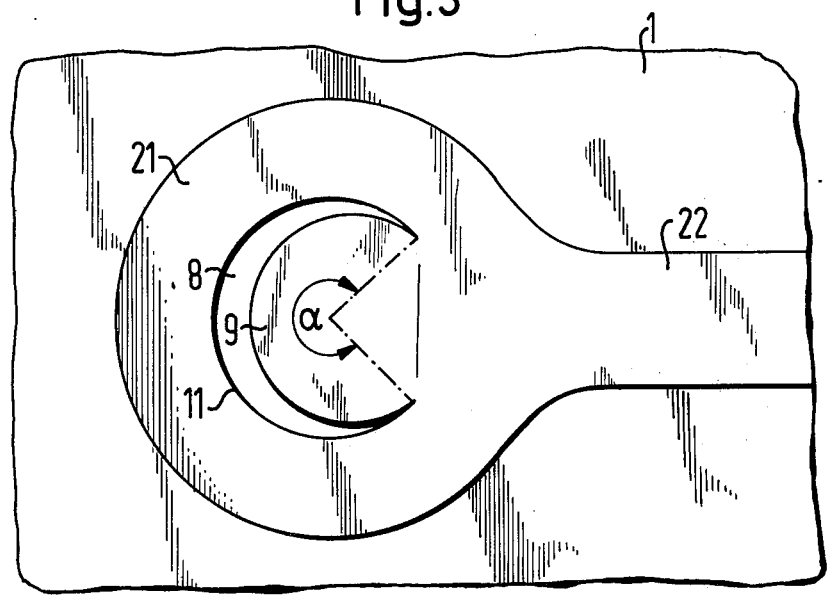

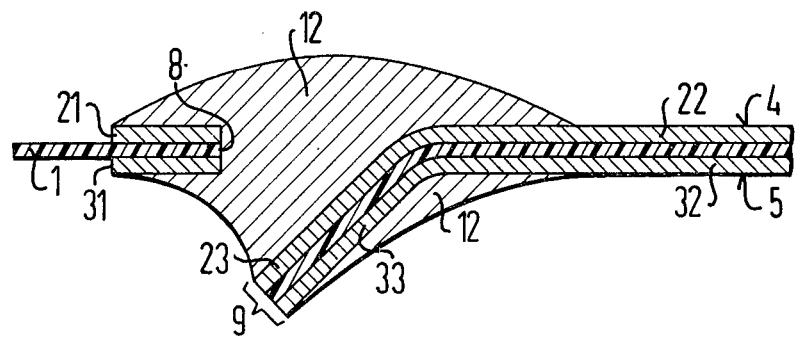
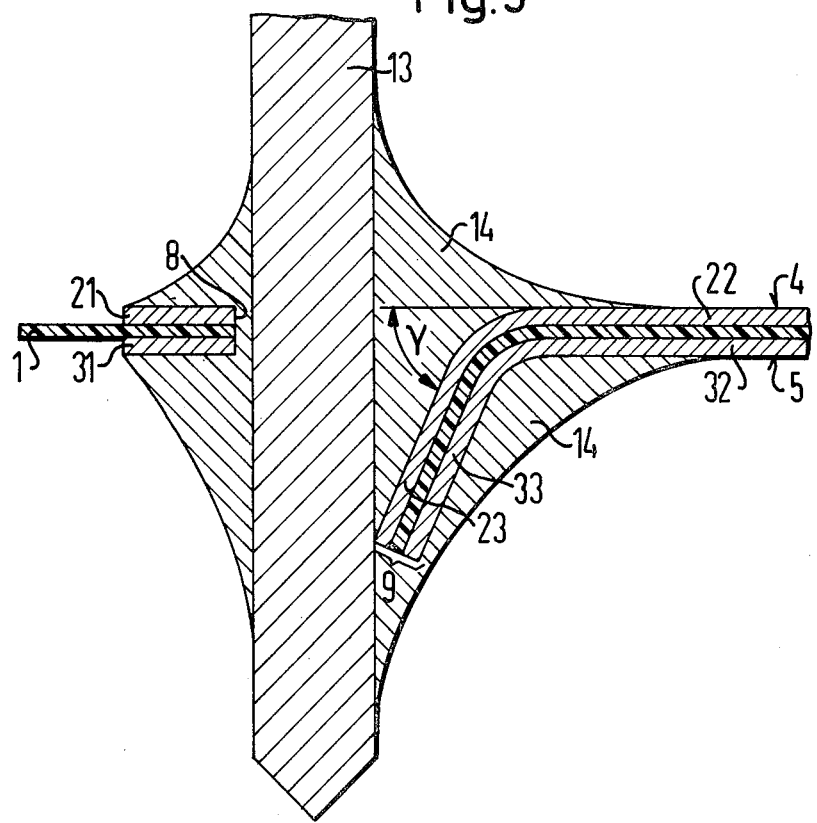

FLEXIBLE THROUGH-CONTACTED PRINTED CIRCUITS

BACKGROUND OF THE INVENTION

1. Field of the Invention

The present invention relates to flexible printed circuit boards having conductor paths on both sides of each insulating sheet and having at least one through-contact, whereby the through-contact is produced by a metal coating about the hole.

2. The Prior Art

Where printed circuit boards carry conductor paths on both sides thereof, through-contacts whereby conductors on opposite sides of the insulating layer are electrically contaced are generally produced by drilling through the board and the conductors and metallizing the walls of the hole via vapor deposition. Producing such contact through a wet chemical or vapor deposition process is wasteful of material and costly. It is also a disadvantage that the entire board is coated and reinforced, reducing the flexibility of the circuit board.

Another form of through-contact has been effected by forming a hole by radial cuts having three or four segments, with the tongues being pushed through to the opposite side of the board. Terminal pins may be inserted through the holes, whereafter solder is flowed into the hole. Where terminal pins are not used, the tongues are laid over onto the undersurface of the board before soldering. Hole-punching dies having the necessary cutters are expensive to produce, and the solder flow between the segmented tongues is restricted. Cracks formed in the tongues during deformation often impede the flow of solder, reducing the mechanical and electrical reliability of the through-contact.

SUMMARY OF THE INVENTION

A printed circuit board having a flexible insulating layer and malleable conductive layers on opposite sides thereof forming an eye and a core region therein has a tongue portion severed from the board at the core region along a non-closed, annular or convexly-extending line, the portion being attached to the board along a hinge line joining ends of the cut line. The tongue portion is bent along the hinge line to an angle from the board, so that conductors on opposite sides of the insulating layer are juxtaposed across a hole or gap. Solder applied to the side of the board to which the tongue extends rises easily through the hole to contact with conductors in the core region reliably. Preferably, the severed line is formed as an arc of a circle, providing a substantially round cross-section to the hole to facilitate spreading of the solder and also the layout of the circuit. Generally, so long as the angle of the non-closed line subtends from 100° to 130°, an adequately large hole results for insertion of a terminal pin and passage for the solder, while retaining the tongue firmly at the edge of the hole. In a preferred embodiment the core material is bent at an angle less than about 90° and typically at an angle of 40 to 50° to the plane of the circuit board, to facilitate spreading of the solder. It is usually possible to bend the tongue or core material further for insertion of a terminal pin, as to an angle of between 60 and 80°. Such additional bending of the core material assists in mechanical retention of the terminal pin.

The method of the present invention comprises the punching of the tongue along a non-closed line from th circuit board material using a bevel-faced die punch, the face having an angle of 40° to 50°. After removal of the punch, the board may be soldered, resulting in the desired board after only two steps.

BRIEF DESCRIPTION OF THE DRAWINGS

FIG. 1 is an edge-wise sectional view through a flexible circuit board useful in the invention.

FIG. 2 shows a step in the production of the through-contact portion of the circuit board, in edge section.

FIG. 3 is a top plan view of a board with a severed tongue portion just before soldering.

FIG. 4 is an edge-wise sectional view through the through-contacted region after soldering.

FIG. 5 is a view similar to FIG. 4 but having a terminal pin inserted through the hole prior to soldering.

DESCRIPTION OF THE PREFERRED EMBODIMENTS

A flexible printed circuit board as shown in FIG. 1 comprises an insulating sheet 1 which is laminated with copper foils 2 and 3 on its respective upper and lower sides. The copper foils 2 and 3 are joined to the insulating sheet 1 by layers of cement, not shown in the drawing. The insulating sheet 1 is in one embodiment 25 $\mu$m thick, the copper foils 2 and 3 being 35 $\mu$m thick and the cement layers being 15 $\mu$m thick each; thus, a total thickness of 125 $\mu$m is represented in FIG. 1.

The conductor pattern as shown in FIG. 3 is formed by any known process, such as photo-etching. In such method, the copper foils 2 and 3 are covered with etching masks where conductive strips are to be retained, by a photo-lithographic process, and the zones not corresponding to the desired conductor patterns are etched away.

FIG. 2 shows a core region wherein the insulator 1 has conductor layers 2 and 3 on each side thereof formed as solder eyes 21, 31, from which conductor paths 22, 32 lead. In the production of the through-contact, the flexible printed circuit board is placed in a tool with a lower or soldering side 5 of the conductor 3 in contact with a cutting plate 6 and oriented so that the core region of the solder eyes 21, 31 overlie holes 61 in the cutting plate 6. A punching die 7 located vertically above one of the holes 61 is moved downwardly in the direction of the arrow in FIG. 2 so that a tongue portion 9 is partially cut from the eye portions 21, 31 and pushed downwardly as shown in FIGS. 2 and 3.

The tongue 9 formed by the punch die 7 and the cutting plate 6 comprises a portion 10 of insulating sheet 1, and portions 23, 33 of the conductors 2, 3, respectively. The tongue 9 is attached to the conductor paths 22, 32 at a bend and has an angle $\beta$ to the plane of the circuit board. The tongue 9 is not completely removed because the punching stroke of the punch die 7 is limited by an abutment surface to the depth of cut shown in FIG. 2.

FIG. 3 shows a plan view of the through-contact point of FIG. 2, showing that the core or tongue 9 is separated from the edge 8 of a hole along an arc of a circle 11 formed in the circuit board. The angle subtended by the arc 11 is identified as $\alpha$. Since a substantial space is provided across the gap between the solder eyes 21, 31 and corresponding core portions 23, 33 on the tongue 9, solder is free to flow upwardly from an undersurface 5 of the board to effect the desired through-contact.

FIG. 4 illustrates a completed through-contact after solder has been flowed into the contact point. The solder 12 is conveniently fed to the undersurface 5 from a surge or wave bath which rises from the soldering side 5 to the component mounting side 4 and coats the soldering eyes 21, 31 and also the conductor portions 23, 33 of the tongue 9. The solder 12 spreads uniformly, guaranteeing an electrically and mechanically reliable through-contact between the conductors 2, 3 on respective upper and lower sides of the insulating layer 1.

FIG. 5 illustrates the through-contact point of FIGS. 2 and 3 having a terminal pin 13 inserted therethrough. The terminal pin 13 optionally has a square, rectangular, or annular section and can lead either to a component or to a spring strip, and loads the tongue 9 by bending it through a greater angle $\gamma$ when inserted. Solder 14 fed to the soldering side 5 from a surge or dip bath rises between the edges of the hole 8 and about the terminal pin 13 and the tongue 9 to the component mounting side 4. Thus, all the conducting foils 23, 33, 21, 31 of the eye and core are coated by the solder 14. Such uniform spreading guarantees an electrically and mechanically reliable through-contact.

The dimensions of the conductor layers, the aperture 8, and the core or tongue 9 need only be sufficient to ensure that apertures remain between the terminal 10, 13 and the edges of the hole 8 to allow the solder to rise. In one embodiment punch dies 7 have been used with diameters of 1.2 mm and faces beveled at an angle of 45°. Correspondingly, the tongue 9 is bent out toward the soldering side at an angle of 45° to the plane of the circuit board. The die extends into the circuit board in the hole 61 of the cutting plate 6 so that the subtended angle $\alpha$ is approximately 270°. A square terminal pin 0.6 mm per side elastically loads the tongue 9 to bend it out by an angle $\gamma$ of 70° from the plane of the circuit board. Outer diameters of the soldering eyes 21 and 31 are 2.4 mm, and the conductor paths 22, 32 have a width of 0.6 mm.

Although various minor modifications may be suggested by those versed in the art, it should be understood that we wish to embody within the scope of the patent warranted hereon all such modifications as reasonably and properly come within the scope of our contribution to the art.

We claim:

1. A flexible printed circuit board comprising:
    a flexible insulating sheet having electrical conductor paths on upper and lower portions thereof at and surrounding a core region, said upper and lower portions respectively defining a component-mounting side and a solder-applying side;
    a tongue portion severed from said board at said core regions along a non-closed, convexly-extending line, said tongue portion being attached to said board along a hinge line joining ends of said non-closed line, said tongue portion being bent so as to extend at an angle of less than 90° toward said solder-applying side so that an overstretching of said conductor paths on upper portions of said insulating sheet is safely avoided; and
    the tongue portion and conductor paths forming, with solder applied on said solder-applying side of said board and allowed to flow and harden onto said core region and into contact with said conductor paths on upper and lower surfaces of said tongue portions, a substantially perfect through-contact between upper and lower portions of the circuit board.

2. A flexible printed circuit board as defined in claim 1, wherein said non-closed, convexly-extending line forms an arc of a circle.

3. A flexible printed circuit board as defined in claim 2, wherein an angle subtended by the arc of said circle is from 240° to 300°.

4. A flexible printed circuit board as defined in claim 1, wherein said tongue extends to one side of the board by an angle of from 40° to 50° from the plane of the circuit board.

5. A flexible printed circuit board as defined in claim 1, further comprising a terminal pin inserted vertically through the circuit board at the core, bending said tongue elastically to an angle of between 60° and 80°.

6. A through-contacted printed circuit board comprising:
    a generally flat sheet of flexible insulating material having upper and lower sides;
    a first and a second conductive layer of material on said upper and lower sides of said insulating sheet, respectively, each of said layers forming an eye portion on opposite sides of said insulating sheet;
    a core region formed at said eye portions of said conductive layers, the core being severed from said board along a non-closed, angularly-extending line and hinged to said board along a straight line extending between ends of said severing line, and the core being angularly disposed at an angle less than about 90° from a plane of said board to a lower side thereof; and
    a quantity of solder flowed onto said core region from said lower side of said board and allowed to harden in contact with said first and second conductive layers to make electrical contact therebetween.

7. A through-contacted printed circuit board as defined in claim 6, further comprising a terminal pin inserted through said eye portion of said board from the upper side of said insulating sheet, the pin bending the tongue to a greater angle to said board and effecting reliable mechanical and electrical connections when said solder is flowed into said joint.

* * * * *